(12) United States Patent
Sakurai

(10) Patent No.: US 7,560,743 B2
(45) Date of Patent: Jul. 14, 2009

(54) ELECTRO-OPTICAL DEVICE, METHOD OF MANUFACTURING THE SAME, AND IMAGE FORMING APPARATUS

(75) Inventor: Kazunori Sakurai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 211 days.

(21) Appl. No.: 11/421,969

(22) Filed: Jun. 2, 2006

(65) Prior Publication Data

US 2006/0278945 A1 Dec. 14, 2006

(30) Foreign Application Priority Data

Jun. 9, 2005 (JP) .............................. 2005-169172

(51) Int. Cl.
*H01L 31/0203* (2006.01)

(52) U.S. Cl. .................... 257/98; 257/433; 257/416; 257/99; 257/100; 257/666; 257/678; 257/734; 257/787; 257/E51.018; 257/E51.022; 257/E25.028

(58) Field of Classification Search ................. 257/416, 257/433, 98, 99, 100, 666, 678, 734, 787

See application file for complete search history.

(56) References Cited

U.S. PATENT DOCUMENTS

| | | | |
|---|---|---|---|
| 7,081,912 B2 | 7/2006 | Seki et al. | |
| 7,189,999 B2 * | 3/2007 | Yamazaki et al. | ............. 257/72 |
| 2005/0189878 A1 * | 9/2005 | Shitagami et al. | ........... 313/512 |
| 2005/0239226 A1 * | 10/2005 | Sakai | .......................... 438/22 |

FOREIGN PATENT DOCUMENTS

| | | |
|---|---|---|
| CN | 2697694 | 5/2005 |
| JP | A-10-172766 | 6/1998 |
| JP | A-2000-036385 | 2/2000 |
| JP | A-2001-307874 | 11/2001 |
| JP | A-2002-124376 | 4/2002 |

* cited by examiner

*Primary Examiner*—Wai-Sing Louie
*Assistant Examiner*—Marc Armand
(74) *Attorney, Agent, or Firm*—Oliff & Berridge, PLC

(57) ABSTRACT

An electro-optical device in which a plurality of light-emitting elements including a first electrode layer, a second electrode layer, and a light-emitting functional layer emitting light in accordance with a voltage between the first electrode layer and the second electrode layer are arranged, the device including: a main substrate; the first electrode layer disposed on the main substrate; the light-emitting functional layer disposed on the first electrode layer; the second electrode layer disposed on the light-emitting functional layer; a plurality of lines which is formed below the light-emitting functional layer on the main substrate and which supplies current to the light-emitting elements or controls the light-emitting elements; a conductor for connecting one of the lines to the second electrode layer; and an insulating protective layer which is formed below the light-emitting functional layer and above the first electrode layer and the lines and which partially covers the lines.

8 Claims, 8 Drawing Sheets

ELECTRO-OPTICAL DEVICE, METHOD OF MANUFACTURING THE SAME, AND IMAGE FORMING APPARATUS

BACKGROUND

1. Technical Field

The present invention relates to an electro-optical device, a method of manufacturing the electro-optical device, and an image forming apparatus using the electro-optical device.

2. Related Art

In recent years, a light-emitting device in which electroluminescence (EL) elements are arranged as light-emitting elements has attracted attention. Unlike liquid crystal elements which vary the amount of transmitted light, the EL element is a current-driven light-emitting element which itself emits light, and has a layer contributing to the emission of light such as a hole injection layer or a light-emitting layer.

In manufacturing such a light-emitting device, examples of a method of forming the layer contributing to the emission of light include a method of forming a layer by applying a material of the layer to a wide area on a main substrate by the use of known methods such as a spin coating method, and selectively removing the layer by irradiating a laser beam to an area (portions other than light-emitting portions) not requiring the layer. According to the known method, a film which serves as the layer contributing to the emission of light can be formed over a plurality of light-emitting elements. Accordingly, the known method is excellent In productivity in comparison with a method of forming a layer by selectively applying the material of the light-emitting elements to their formation positions.

In the known method, a UV laser such as an excimer layer or a UV yttrium aluminum garnet (YAG) laser is used as the laser for selectively removing the layer. A laser using krypton fluoride with a wavelength of two hundred and several tens of nanometers can be used as the excimer laser. On the other hand, an infrared laser (for example, $CO_2$ laser) may be used, but since it destroys a layer under the layer to be removed and leaves much processing residue, an infrared laser is not desirable.

A variety of lines to which terminals from an external device for driving or controlling the EL elements are connected are formed on the main substrate. The formation of lines is performed before forming the layer contributing to the emission of light, and the connection of the lines to the terminals from the external device is performed after forming the layer over a wide area. Accordingly, the portions, to which the terminals from the external device are connected, of the lines should be exposed by selectively removing the layer. However, the removal of the layer cannot be performed sufficiently by the use of the UV laser beam. Therefore, it is not possible to connect the lines on the main substrate to the terminals from the external device with sufficient strength and low resistance.

In addition, since it is necessary to connect electrodes (for example, cathodes) formed on the layer contributing to the emission of light to the lines (for example, cathode terminals) on the main substrate, the layer contributing to the emission of light should be removed from the connection positions, thereby exposing the lines. However, when the layer is not sufficiently removed, the resistance of the connection positions increases, thereby not obtaining a desired emission characteristic.

In order to solve the above-mentioned problems, the use of a wet etching method using a liquid agent for selectively removing the layer has been considered. However, since the layer contributing to the emission of light can be immersed in moisture or solvent, the method cannot be employed without being modified. Other examples of the etching method include an oxygen plasma etching method and an ion etching method using nitrogen or argon, but since the methods are isotropic and it is thus difficult to selectively remove the layer by the use of the methods, the methods can be employed without any modification.

Another method of manufacturing a light-emitting device (organic EL device) is described in JP-A-2002-124376. In the method, lines (anode terminal and cathode terminal) are first formed on a main substrate and then a layer is formed by applying a material of a layer contributing to emission of light over a wide area of the main substrate by the use of a spin coating method. Thereafter, by dropping a solvent for dissolving the material and a liquid containing silver, formation of a through-hole reaching the cathode terminal and filling of the through-hole with silver are performed. Then, by forming a cathode layer to cover the through-hole, the cathode layer is connected to the cathode terminal.

However, it is not described in JP-A-2002-124376 that a film which serves as the layer contributing to the emission of light is selectively removed. In the publication, it is described that a light-emitting layer and a hole injection layer are substantially left on the lines of the main substrate after the cathode layer is connected to the cathode terminal with silver, and a process of connecting the lines on the main substrate to terminals of an external device is not described. Even when selective removal of the unnecessary film is attempted by irradiating a laser beam only to an area not requiring the layer on the lines like in the known method, the removal of the film is not sufficient as described above. Accordingly, the connection strength is not sufficient and the resistance is increased.

SUMMARY

An advantage of the present invention is that it provides an electro-optical device in which it is necessary to connect terminals from an external device for driving or controlling light-emitting elements to lines on a main substrate and which can be manufactured by the use of a method of sufficiently removing an unnecessary portion of a film, which serves as a layer contributing to emission of light, from the lines at one time, a method of manufacturing the electro-optical device, and an image forming apparatus employing the electro-optical device.

According to an aspect of the invention, there is provided an electro-optical device in which a plurality of light-emitting elements including a first electrode layer, a second electrode layer, and a light-emitting functional layer emitting light in accordance with a voltage between the first electrode layer and the second electrode layer are arranged, the electro-optical device comprising: a main substrate; the first electrode layer disposed on the main substrate; the light-emitting functional layer disposed on the first electrode layer; the second electrode layer disposed on the light-emitting functional layer; a plurality of lines which are formed below the light-emitting functional layer on the main substrate and which supply current to the light-emitting elements or control the light-emitting elements; a conductor for connecting one of the lines to the second electrode layer; and an insulating protective layer which is formed below the light-emitting functional layer and above the first electrode layer and the lines and which partially covers the lines. Each line has an external connection portion, to which a terminal of an external device outside the main substrate is connected, thereon.

The protective layer does not overlap the external connection portions. First through-holes are formed through the protective layer on the first electrode layer, and the first electrode layer is connected to the light-emitting functional layer through the first through-holes. The second electrode layer is closely bonded to an area, which overlaps the first through-holes, of the light-emitting functional layer, and covers the area. Second through-holes filled with the conductor are formed through the protective layer on the lines connected to the second electrode layer through the conductor, and the second electrode layer is disposed so as not to overlap any of the second through-holes and the external connection portion.

Here, the "light-emitting elements" include organic EL elements and inorganic EL elements. The "electro-optical device" includes a variety of light-emitting devices, lighting devices, and image display devices. The "first electrode layer" and the "second electrode layer" are an anode layer or a cathode layer. When the "first electrode layer" is an anode layer, the "second electrode layer" is a cathode layer and when the "first electrode layer" is a cathode layer, the "second electrode layer" is an anode layer. The "light-emitting functional layer" is a layer which is interposed between the anode layer and the cathode layer and which contributing to the emission of light, and includes at least a light-emitting layer. The "light-emitting functional layer" may include only a single light-emitting layer or may include a plurality of layers. For example, the "light-emitting functional layer" may include a light-emitting layer and a hole injection layer, or may include an electron injecting layer, an electron transporting layer, a light-emitting layer, a hole transporting layer, and a hole injection layer.

According to the electro-optical device, since the first electrode layer and the second electrode layer are disposed on and under the first through-holes formed through the insulating protective layer, the area of the first through-holes serves an area where the light-emitting functional layer efficiently emits light, that is, a pixel area. Since the second electrode layer covers at least an area, which overlaps the first through-holes, of the light-emitting functional layer, that is, the pixel area, the second electrode can be used as a mask when removing the light-emitting functional layer other than the pixel area by the use of an etching method after applying a material of the light-emitting functional layer widely on the main substrate, in manufacturing the electro-optical device. In addition, since the second electrode layer is in close contact with the light-emitting functional layer. Accordingly, even when an isotropic etching method such as an oxygen plasma etching method is used, the etching medium such as plasma can be prevented from infiltrating the boundary between the second electrode layer and the light-emitting functional layer, thereby not damaging the light-emitting functional layer.

In the electro-optical device, when the material of the light-emitting functional layer is applied widely on the main substrate to form a layer, the lines and the protective layer, which are disposed below the light-emitting functional layer, on the main substrate are covered with the layer. However, the second electrode layer does not overlap the second through-holes of the protective layer. Accordingly, when the light-emitting functional layer is isotropically etched after the light-emitting functional layer is formed to cover the protective layer, the light-emitting functional layer can be sufficiently removed from the second through-holes and thus the lines can be exposed through the second through-holes. Accordingly, the second through-holes formed through the insulating protective layer can be filled with the conductor and the second electrode layer can be satisfactorily connected to the lines through the conductor. Since the protective layer does not overlap the external connection portion on the lines and the second electrode layer does not also overlap the external connection portion, the light-emitting layer on the external connection portion can be sufficiently removed by the isotropic etching method and thus the external connection portion of the lines can be exposed. As described above, according to the electro-optical device, after applying the material of the light-emitting functional layer widely on the main substrate in manufacturing the electro-optical device, it is possible to sufficiently remove the unnecessary light-emitting functional layer on the lines at a time by using the second electrode layer as a mask. This contributes to enhancement in productivity and quality of the electro-optical device.

On the other hand, a sealing resin for preventing oxidation of the second electrode layer may be closely bonded onto an area, which overlaps the first through-holes, of the second electrode layer, and the conductor may be closely bonded onto an area, which the sealing resin is not bonded to, of the second electrode layer. Here, the "close contact" means that the second electrode layer and the sealing resin (or conductor comes in direct contact with each other without any gap and any other material such as an adhesive therebetween. In this configuration, since the sealing resin for preventing the oxidation of the second electrode layer is closely bonded onto the area (pixel area), which overlaps the first through-holes, of the second electrode layer. Accordingly, even when the light-emitting functional layer other than the pixel area is removed by the use of the oxygen plasma etching method, the oxidation of the second electrode layer is suppressed in at least the pixel area. In addition, since the second electrode layer and the sealing resin are in close contact with each other, oxygen can be prevented from infiltrating the boundary surface between the second electrode layer and the light-emitting functional layer. Even when methods other than the oxygen plasma etching method are used as a method of removing the light-emitting functional layer other than the pixel area, the possibility of increase in resistance due to the oxidation of the second electrode layer in an oxygen atmosphere such as an atmosphere can be reduced. In addition, since the conductor is also closely bonded onto the area, which the sealing resin is not bonded to, of the second electrode layer, it is possible to suppress the oxidation of the second electrode layer in the area onto which the sealing resin is not bonded is suppressed to some extent, thereby preventing the increase in resistance of the second electrode layer.

According to another aspect of the invention, there is provided an image forming apparatus comprising: an image carrier; a charging unit for electrically charging the image carrier; one of the electro-optical devices described above in which a plurality of the light-emitting elements are arranged and light is irradiated to a charged surface of the image carrier by the use of the plurality of light-emitting elements to form a latent image; a developing unit for forming a toner image on the image carrier by attaching a toner to the latent image; and a transfer unit for transferring the toner image to a body from the image carrier.

According to the above-mentioned image forming apparatus, since one of the electro-optical devices described above is used as a writing unit, it is possible to decrease the size of the apparatus in comparison with an apparatus employing a laser scanning optical system. In addition, by employing one of the electro-optical devices described above, it is possible to contribute to enhancement in productivity and quality of the image forming apparatus.

BRIEF DESCRIPTION OF THE DRAWINGS

The invention will be described with reference to the accompanying drawings, wherein like numbers reference like elements.

Figure 10:
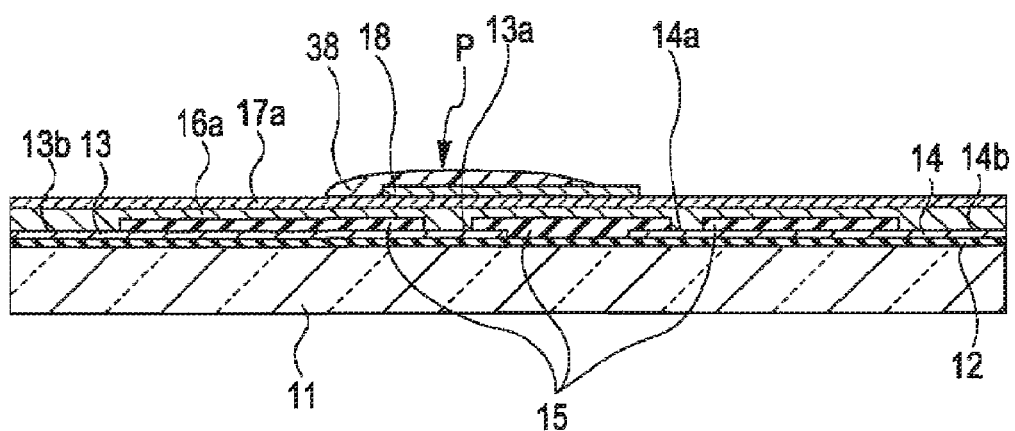
FIG. 10 is a diagram illustrating a step of a procedure of manufacturing the light-emitting device.

11 is a diagram illustrating a step subsequent to the step shown in FIG. 10.

Figure 11:
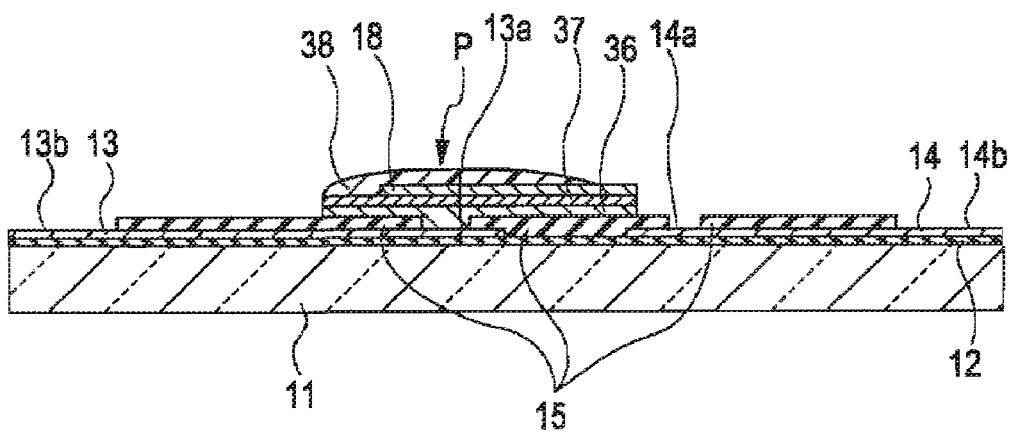
Figure 12:
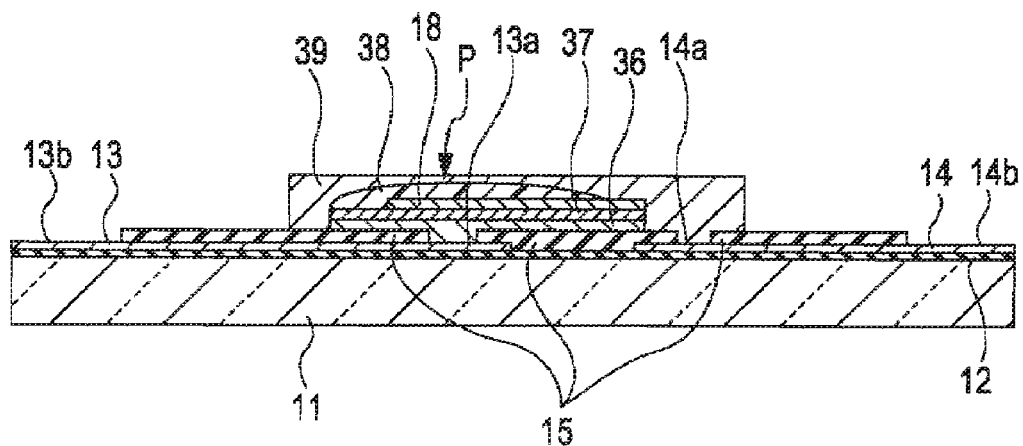

FIG. 12 is a diagram illustrating a step subsequent to the step shown in FIG. 11.

Figure 13:
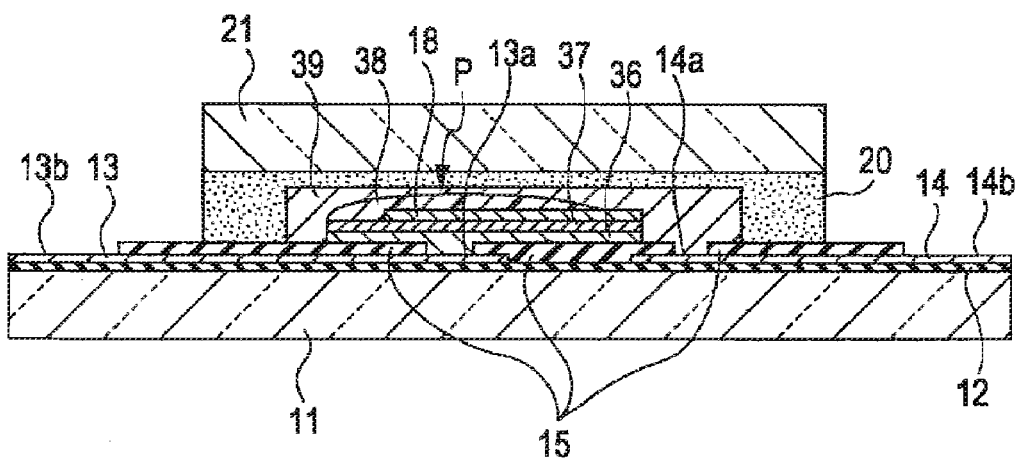

FIG. 13 is a diagram illustrating a step subsequent to the step shown in FIG. 12.

Figure 2:
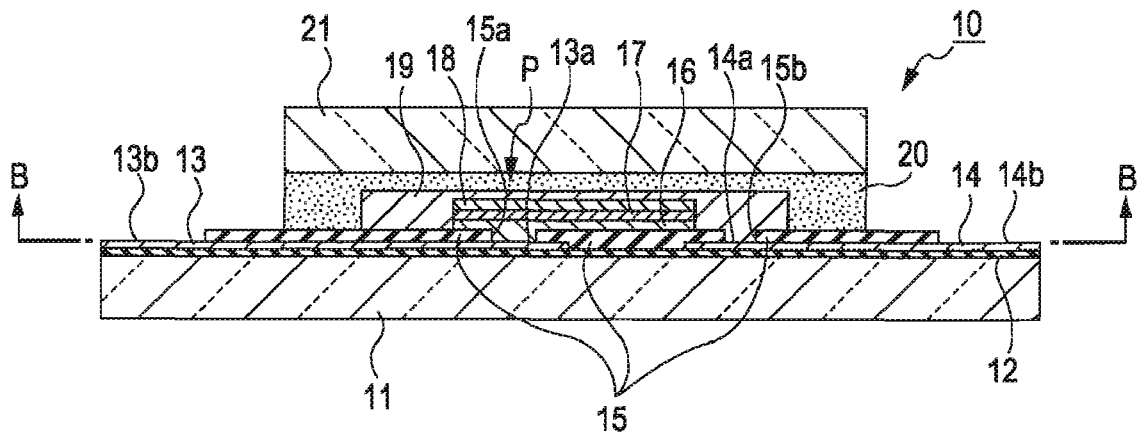
FIG. 2 is a cross-sectional view taken along Line A-A of FIG. 1.
Figure 14:
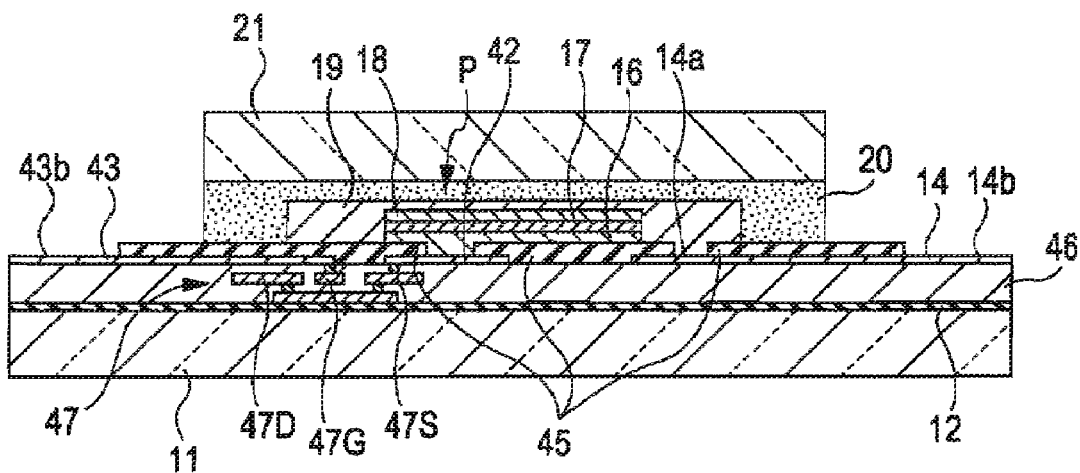

FIG. 14 is a cross-sectional view, similar to FIG. 2, illustrating a light-emitting device (electro-optical device) according to a modified example of the light-emitting device.

Figure 15:
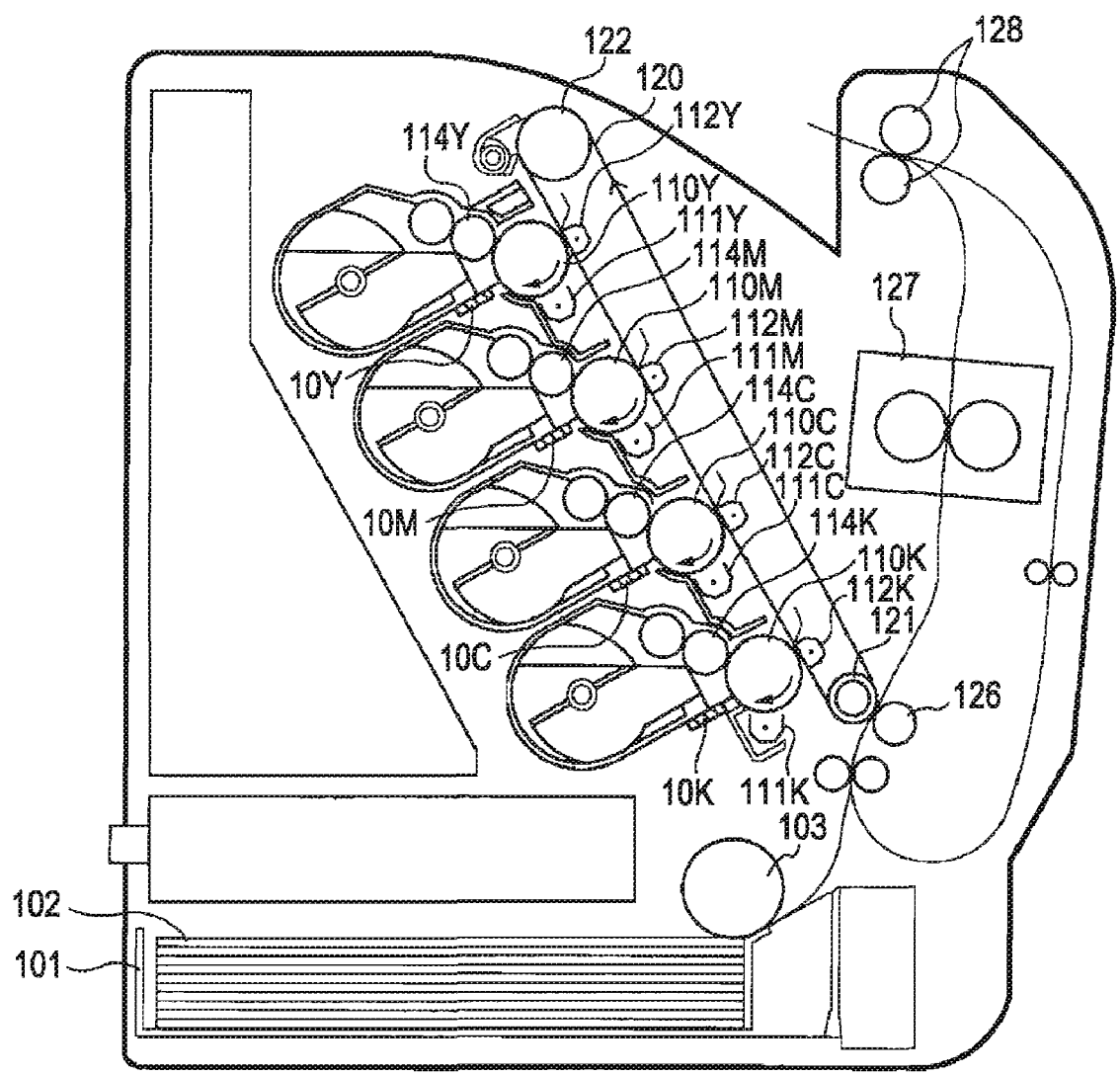

FIG. 15 is a longitudinal sectional view illustrating an example of an image forming apparatus using the light-emitting devices according to the embodiments and the modified example of the invention as a line-type exposure head.

Figure 16:
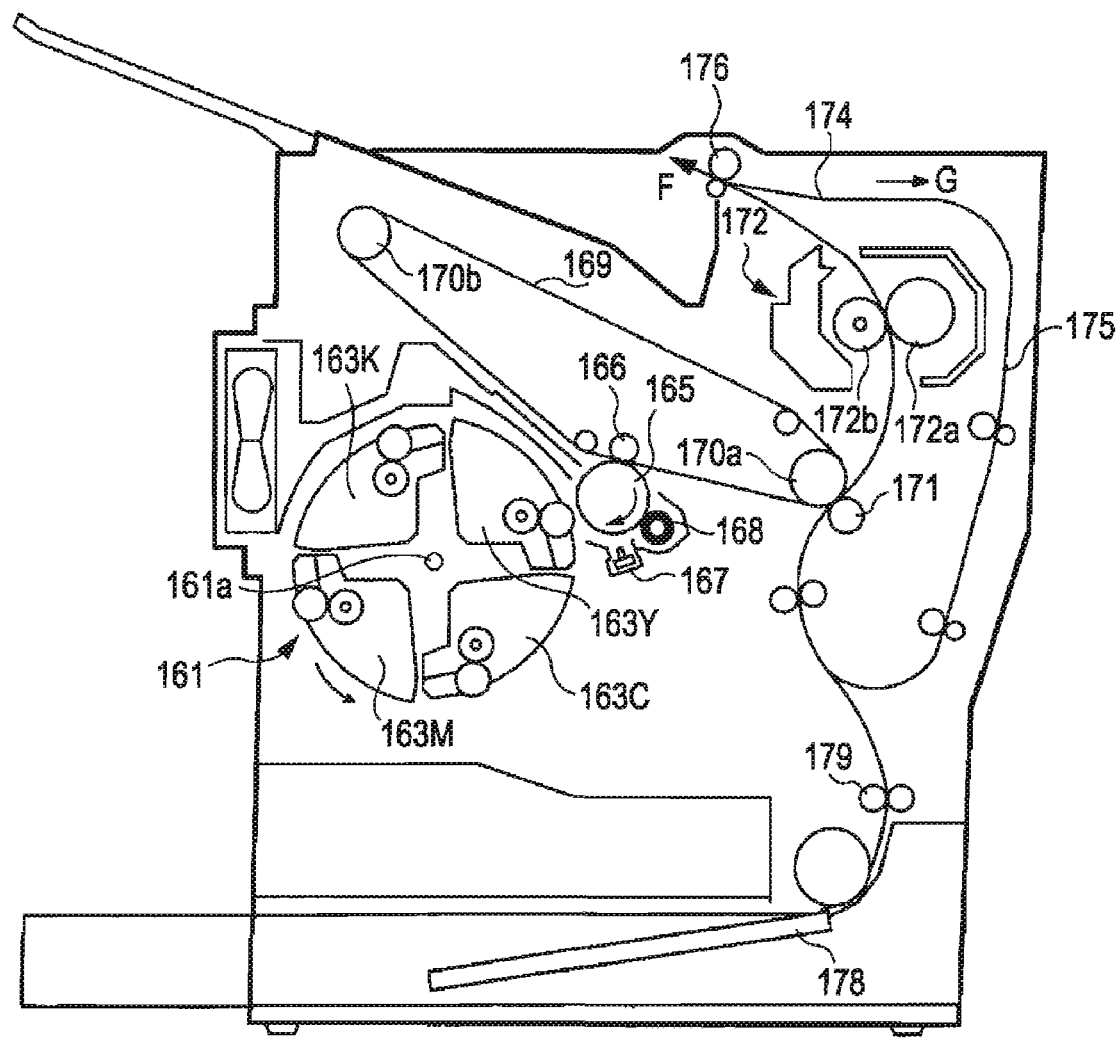

FIG. 16 is a longitudinal sectional view illustrating another example of the image forming apparatus using the light-emitting devices according to the embodiments and the modified example of the invention as a line-type exposure head.

Figure 17:
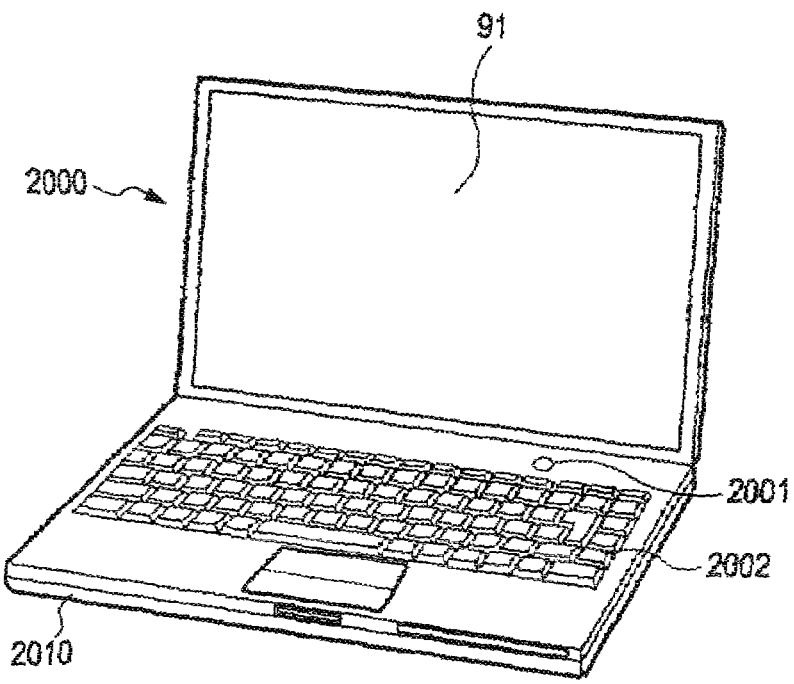

FIG. 17 is a perspective view illustrating an example of an image forming apparatus using the light-emitting devices according to the embodiments and the modified example of the invention.

Figure 18:
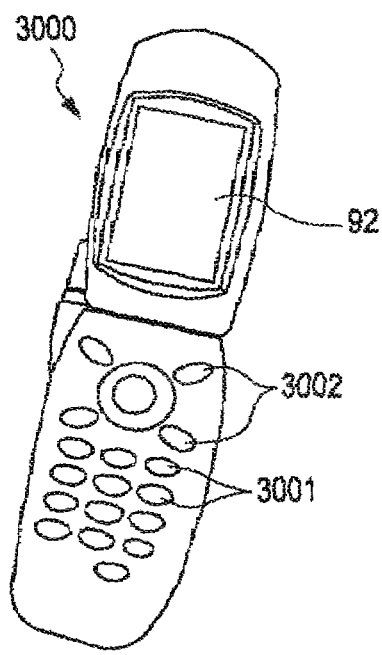

FIG. 18 is a perspective view illustrating another example of the image forming apparatus suing the light-emitting devices according to the embodiments and the modified example of the invention.

DESCRIPTION OF EXEMPLARY EMBODIMENTS

Hereinafter, various embodiments according to the present invention will be described with reference to the attached drawings. In the drawings, the sizes of elements are different from their actual sizes for ease of viewing.

First Embodiment

Figure 1:
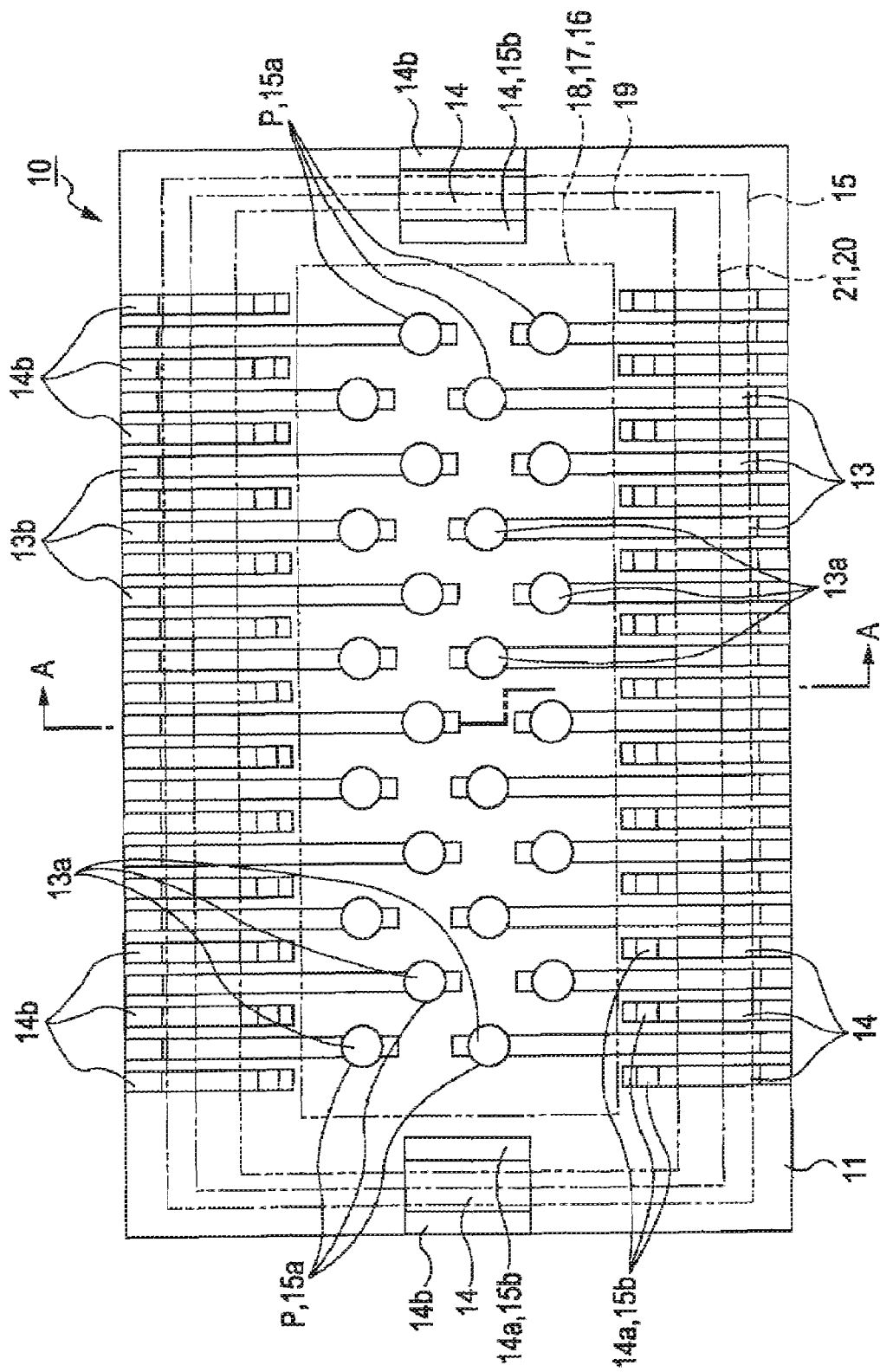
FIG. 1 is a plan view illustrating a light-emitting device (electro-optical device) according to a first embodiment of the invention.

FIG. 1 is a horizontal sectional view illustrating a light-emitting device (electro-optical device) 10 according to the first embodiment and FIG. 2 is a cross-sectional view taken along Line A-A of FIG. 1. Specifically, FIG. 1 is a sectional view taken along Line B-B of FIG. 2. A protective layer 15 to be described later and elements above the protective layer are denoted by dot-dash lines in FIG. 1 to enable easy understanding.

As shown in, FIG. 1, four lines of pixel areas P are arranged in a zigzag shape on a main substrate 11 of the light-emitting device 10. Each pixel area P emits light in a direction perpendicular to the plane of the drawing. In this specification, a portion contributing to the emission of light in each pixel area P is referred to as a light-emitting element (including an anode layer 13a, a hole injection layer 16, a light-emitting layer 17, and a cathode layer 18). A layer (a set of the hole injection layer and the light-emitting layer 17) interposed between the anode layer and the cathode layer so as to contribute to the emission of light is referred to as a light-emitting functional layer. Anode terminals (lines) 13 and cathode terminals (lines) 14 are alternately disposed in the vicinity of the two long sides of the main substrate 11. The cathode terminals 14 are disposed in the vicinity of the two short sides of the main substrate 11. A source potential is supplied to the light-emitting element corresponding to each pixel area P through the cathode terminals 13. Each anode terminal 13 extends to one of the long sides of the main substrate 11 from the pixel area P corresponding to the anode terminal 13.

A cathode layer (second cathode) 18 common to all the light-emitting elements, that is, all the pixel areas P and a cathode-coating conductive layer (conductor) 19 are disposed in the light-emitting device 10. The light-emitting elements of all the pixel areas P have a single cathode layer 18 in common, and a plurality of cathode terminals 14 is connected to the cathode-coating conductive layer 19 contacting the cathode layer 18. A ground potential is supplied to all the light-emitting elements through the cathode terminals 14. Each cathode terminal extends to an edge of the main substrate 11 from an area immediately under the cathode-coating conductive layer. A cathode contact portion 14a contacting the cathode-coating conductive layer 19 is disposed on an end of each cathode terminal 14. A single cathode terminal may be connected to the cathode layer 18, but by disposing a plurality of cathode terminals 14 close to a plurality of pixel areas P as shown in the figure, it is possible to minimize non-uniformity in resistance and voltage drop from the cathode terminals 14 to the pixel areas P, thereby making the emission brightness of all the pixel areas P substantially uniform.

As shown in FIG. 2, the light-emitting device 10 has a structure in which the light-emitting elements are interposed between a plate-shaped main substrate 11 and a plate-shaped sealing substrate 21, and is manufactured by stacking the layers on the main substrate 11. Expressions "overlap" and "cover" used in this specification indicate the arrangement of layers as seen in the direction perpendicular to the main substrate 11 (in the direction perpendicular to the sheet plane in FIG. 1 and in the vertical direction in FIG. 2). The light from the pixel areas P of the light-emitting elements travels through the main substrate 11. That is, the light-emitting device 10 is of a bottom emission type. In this specification, the side directed to the main substrate 11 is the bottom side and the side directed to the sealing substrate 21 is the top side, in the direction perpendicular to the main substrate 11.

The main substrate 11 is formed of a suitable transparent material such as glass or plastic, and the top surface thereof is covered with a base insulating layer 12 formed of a transparent insulating material such as $SiO_2$. Conductive lines are selectively formed on the base insulating layer 12. The lines are used as the anode terminals 13 or the cathode terminals 14.

Anode layers (first electrode layers) 13a are connected to the anode terminals 13. In the configuration shown in the figure, the anode terminals 13 and the anode layers 13a are integrally formed of a conductive material such as ITO (Indium Tin Oxide) transmitting light. Portions exactly overlapping the pixel areas P serve as the anode layers 13a and the other portions serve as the anode terminals 13. Since the anode layers 13a necessarily have a light transmitting property but the anode terminals 13 do not necessarily transmit light, the anode terminals 13 may be formed of a conductive material not transmitting light. That is, the anode terminals 13 may be formed of a material such as aluminum or molybdenum, or may have a two-layered structure of an ITO layer common to the anode layers 13a and a thin metal layer. In this modification, it is possible to decrease the resistance of the anode terminals 13. The top surfaces of the ends of the anode terminals 13 on the long sides of the main substrate 11 serve as external connection portions 13b to which terminals of a flexible board not shown are connected (see FIG. 1). The flexible board is connected to an external device which serves to drive or control the light-emitting elements and which is disposed outside the main substrate 11.

The cathode terminals 14 are formed of a material such as ITO, aluminum, and molybdenum. The top surfaces of the ends of the cathode terminals 14 on the outer edges of the main substrate 11 serve as external connection portions 14b to which terminals of the flexible board (not shown) are connected. The cathode contact portions 14a are disposed on the top surfaces of the other ends of the cathode terminals 14.

As shown in FIG. 2, a protective layer 15 is formed on the base insulating layer 12, the anode terminals 13, and the cathode terminals 14 to cover them. The protective layer 15 is formed of an insulating material such as $SiO_2$ or SiNx. The material of the protective layer 15 protects a light-emitting functional layer, to be described later, against etching. That is, even when the protective layer 15 i etched, the light-emitting functional layer is negligibly damaged. The outline of the protective layer 15 is rectangular as indicated by a dot-dash line in FIG. 1. Accordingly, the protective layer 15 does not cover the external connection portions 130b and 14b. In other words, the ends, which are close to the outer edges of the main substrate 11 not overlapping the protective layer 15, of the anode terminals 13 and the cathode terminals 14 can be used as the external connection portions 13b and 14b for connection to an external device.

First through-holes 15a and second through-holes 15b are formed through the protective layer 15. The anode layers 13a are in close contact with the light-emitting functional layer (the set of the hole injection layer 16 and the light-emitting layer 17 in the first embodiment), to be described later, via the first through-holes 15a. Since the anode layers 13a and the cathode layer 18 are respectively disposed on and under the through-holes 15a formed in the insulating protective layer 15, areas corresponding to the first through-holes 15a serve as areas where the light-emitting functional layer efficiently emits light, that is, pixel areas P.

The second through-holes 15b of the insulating protective layer 15 are filled with a part of the above-mentioned cathode-coating conductive layer 19 connected to the cathode layer 18, and are in surface contact with the cathode terminals 14. That is, the areas corresponding to the second through-holes 15b serve as cathode contact portions 14a, which are connected to a cathode-coating conductive layer 19, of the cathode terminals 14.

A hole injection layer 16 transmitting light is formed on the protective layer 15 and the anode layers 13a, a light-emitting layer 17 emitting light from its surface is formed of an EL material and is disposed on the hole injection layer 16, the cathode layer 18 is formed of a metal material such as aluminum, potassium, and magnesium and is disposed on the light-emitting layer 17. The light-emitting layer 17 is in close contact with the hole injection layer 16 and the cathode layer 18 disposed on and under the light-emitting layer, respectively. The outlines of the hole injection layer 16, the light-emitting layer 17, and the cathode layer 18 all form a rectangular shape as indicated by a dot-dash line in FIG. 1. That is, the light-emitting device 10 has the cathode layer 18, the hole injection layer 16, and the single light-emitting layer 17, and the outlines of the hole injection layer 16, the light-emitting layer 17, and the cathode layer 18 are arranged to be the same as seen in a direction perpendicular to the plane of FIG. 1.

Accordingly, in the first embodiment, the cathode layer 18, the hole injection layer 16, and the light-emitting layer 17 are commonly used for the light-emitting elements of all the pixel areas P. In the individual pixel areas P, the anode layer 13a, the hole injection layer 16, the light-emitting layer 17, and the cathode layer 18 constitute a light-emitting element.

The cathode layer 18 is coated with the cathode-coating conductive layer 19. The outline of the cathode-coating conductive layer 19 is rectangular as indicated by a dot dash line in FIG. 1. The cathode-coating conductive layer 19 is formed of a metal material such as aluminum. The cathode-coating conductive layer 19 is closely bonded to the whole top surface of the cathode layer 18, and a portion drawn out of the cathode layer 18 covers the side surfaces of the cathode layer 18, the hole injection layer 16, and the light-emitting layer 17 and is in close contact with the top surface of a part of the protective layer 15. In addition, a part of the cathode-coating conductive layer 19 is filled in the second through-holes 15b to cover the cathode contact portions 14a of the cathode terminals 14. That is, the cathode layer 18 is connected to the cathode contact portions 14a of the cathode terminals 14 through the cathode-coating conductive layer 19.

In the first embodiment, since the cathode-coating conductive layer 19 completely surrounds the whole cathode layer 18 in cooperation with other members, the cathode layer 18 is protected from the external environment to suppress chemical variations such as oxidation even before performing a sealing process using a sealing substrate 21 to be described later. This advantage is markedly present specifically when the cathode layer 18 is formed of calcium or potassium which has a high reactivity, and helps to elongate the lifetime of the light-emitting device 10 when the cathode layer 18 is formed of aluminum which has a reactivity lower than that of the above-mentioned materials. However, the cathode-coating conductive layer 19 does not necessarily have to be used, and the cathode layer 18 may be connected to the cathode terminals 14 through another conductor. That is, the conductor is sufficient if only it is filled in the second through-holes 15b and is in contact with the cathode contact portions 14a of the cathode terminals 14 and any portion of the cathode layer 18.

A sealing substrate 21 is fixed to the main substrate 11 or preferably the protective layer 15) so as to seal the hole injection layer 16, the light-emitting layer 17, the cathode layer IS, and the cathode-coating conductive layer 19. The sealing substrate 21 serves to protect the hole injection layer 16, the light-emitting layer 17, the cathode layer 18, and the cathode-coating conductive layer 19 from external air in cooperation with the main substrate 11, and is formed of a material such as glass. The fixation of the sealing substrate 21 to the main substrate 11 is performed by the use of a thermo-setting or UV-curable adhesive 20. The sealing substrate 21 and the adhesive 20 are disposed so as not to overlap the external connection portions 13b and 14b of the anode terminals 13 and the cathode terminals 14.

Examples of a sealing method using the sealing substrate 21 include a film sealing method and a cap sealing method. The light-emitting device 10 is manufactured using the film sealing method, but the adhesive 20 comes in contact with the bottom surface of the sealing substrate 11 and the top surface of the main substrate 11 (or preferably the protective layer 15) when using any sealing method.

A procedure of manufacturing the light-emitting device 10 is described.

Figure 3:
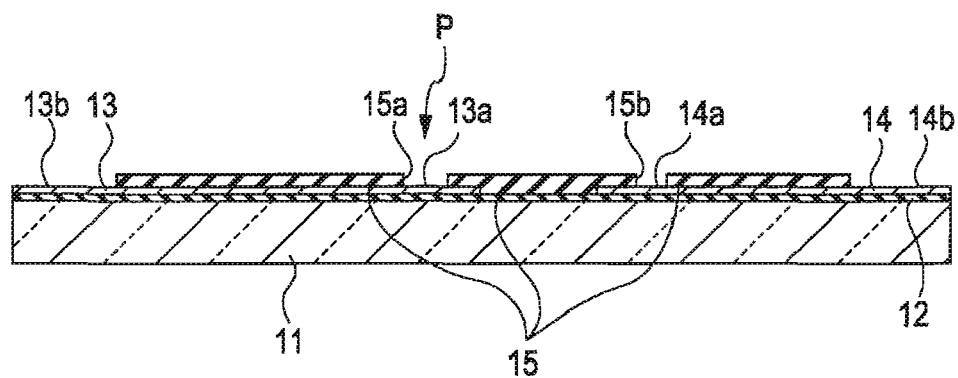
FIG. 3 is a diagram illustrating a first step of a procedure of manufacturing the light-emitting device.

First, as shown in FIG. 3, the base insulating layer 12 is formed with a uniform thickness on the top surface of the main substrate 11. Then, conductive lines (that is, the anode terminals formed integrally with the anode layers 13a and the cathode terminals 14) are selectively formed on the base insulating layer 12. Next, the protective layer 15 having the first through-holes 15a and the second through-holes 15b is selectively formed on the base insulating layer 12, the anode terminals 13, and the cathode terminals 14. In the process of forming the protective layer 15, the protective layer 15 may be deposited with a uniform thickness over the entire top surface of the main substrate 11 and then the edge portions, the first through-holes 15a, and the second through-holes 15b may be removed by etching. Alternatively, after masking the portions corresponding to the edges, the first through-holes 15a, and the second through-holes 15b so as to allow the material-a of the protective layer not to be deposited on the portions, the protective layer 15 may be deposited with a uniform thickness and then the mask may be removed. As a result, the external connection portions 13b of the anode terminals 13, the anode layers 13a, the cathode contact portions 14a of the cathode terminals 14, and the external connection portions 14b are exposed through the protective layer 15.

Figure 4:
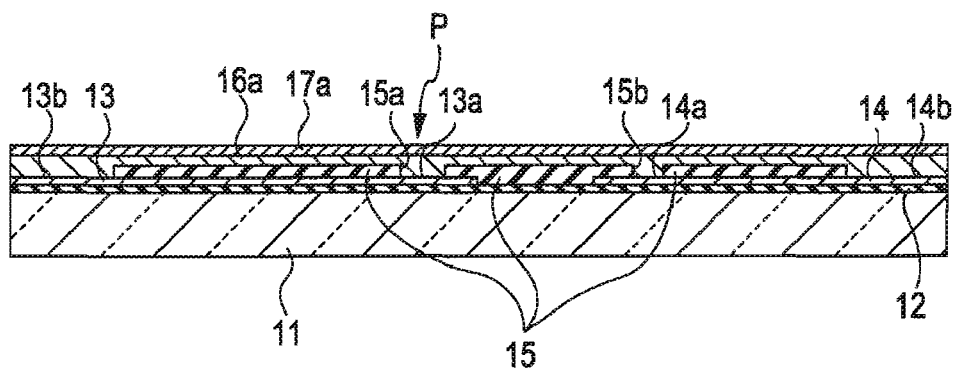
FIG. 4 is a diagram illustrating a step subsequent to the step shown in FIG. 3.

Next, as shown in FIG. 4, the liquid material of the hole injection layer 16 is applied onto the main substrate 11 by the use of a spin coating method, and is dried and solidified. Accordingly, a hole injection film 16a which becomes the hole injection layer 16 is formed closely on the protective layer 15 and the film is exposed to the protective layer 15. At this time, the first through-holes 15a formed through the protective layer 15 are filled with the material of the hole injection film 16a. Next, the liquid material of the light-emitting layer 17 is applied widely onto the main substrate 11 by the use of the spin coating method, and is dried and solidified. Accordingly, a light-emitting film 17a which becomes the light-emitting layer 17 is formed closely on the hole injection film 16a. As a result, the light-emitting functional layer is formed.

Examples of a method of forming the light-knitting functional layer over a wide area other than the spin coating method include printing methods such as a screen printing method, a slit coating method, and a flexographic printing method, an immersing method, and a spray method. However, since it is difficult to control the thickness of the film by the use of the above-mentioned methods, the light-emitting device 10 is preferably manufactured by the use of the spin coating method. On the other hand, when the material used for forming the film is a solid, a method of forming a film using a solid material, such as an evaporation method, may be employed. Next, the cathode layer 18 is selectively formed.

Figure 5:
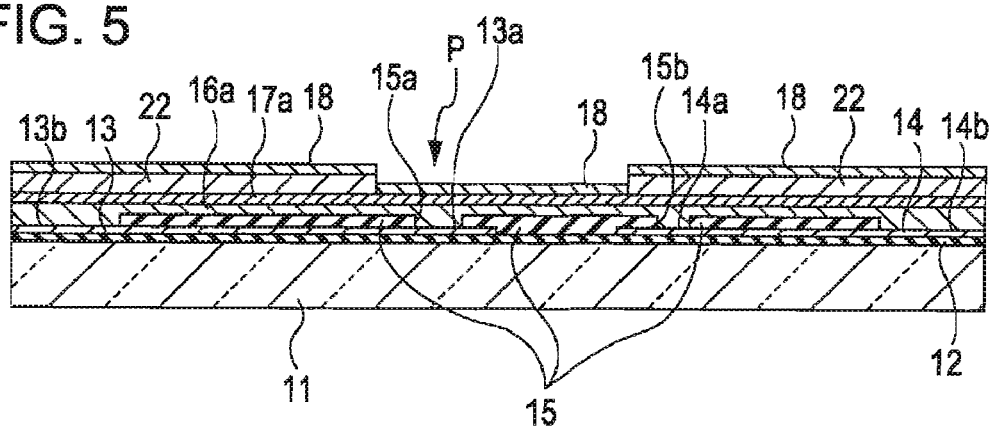
FIG. 5 is a diagram illustrating a step subsequent to the step shown in FIG. 4.

Specifically, as shown in FIG. 5, first, a metal mask 22 in which a portion corresponding to the cathode layer 18 is opened is arranged to cover the light-emitting film 17a. This arrangement is performed so that all the pixel areas P are exposed to the opening of the metal mask 22 and the opening does not overlap the cathode contact portions 14a, the external connection portions 13b, and the external connection portions 14b. Next, the cathode layer 18 is formed on the light-emitting film 17a exposed to the opening of the metal mask 22 and the metal mask 22 by the use of the evaporation method or a sputtering method. At this time, the cathode electrode 18 is in close contact with the light-emitting film 17a through the opening of the metal mask 22.

Figure 6:
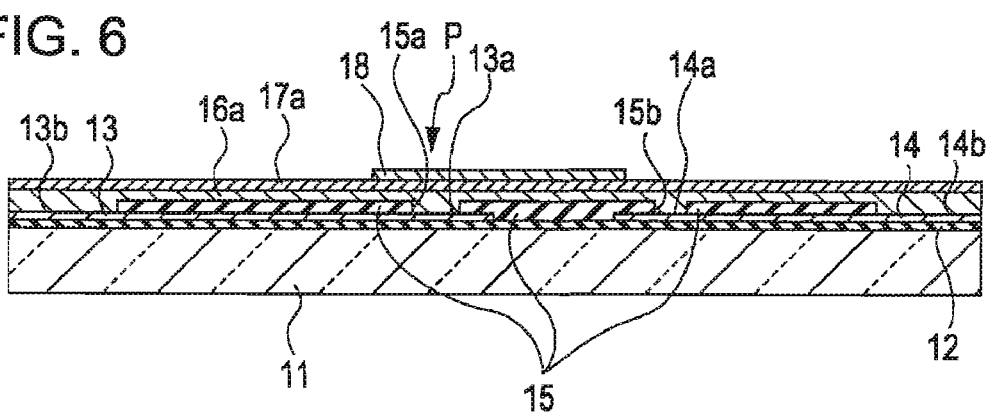
FIG. 6 is a diagram illustrating a step subsequent to the step shown in FIG. 5.

As shown In FIG. 6, the metal mask 22 is then removed. As a result, only the portion, which is in close contact with the light-emitting film 17a, of the cathode layer 18 is left. In this way, it is possible to obtain the cathode layer 18 covering the pixel areas P but not overlapping the cathode contact portions 14a, the external connection portions 13b, and the external connection portions 14b. On the other hand, when the light-emitting elements are inorganic EL elements, a method of disposing the material of the cathode layer 18 on the whole surface of the main substrate 11 and forming the cathode layer 18 by the use of photolithographic etching may be used.

Figure 7:
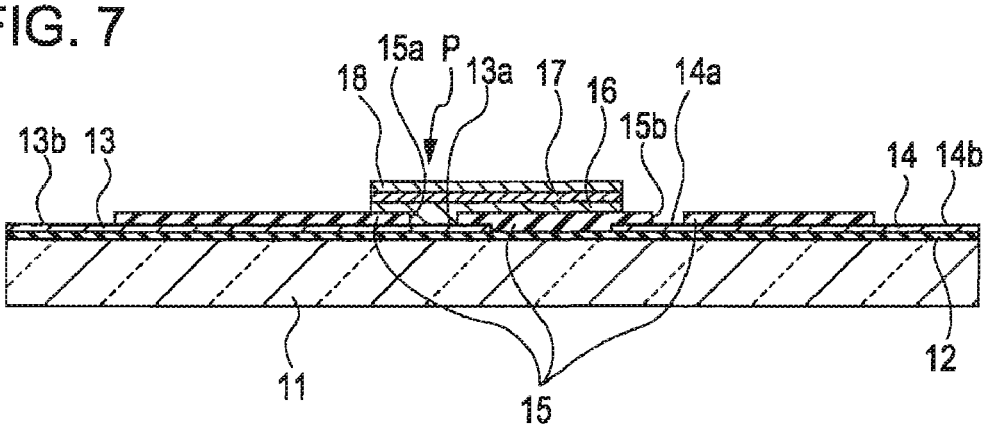
FIG. 7 is a diagram illustrating a step subsequent to the step shown in FIG. 6.

After the selective formation of the cathode layer 18, as shown in FIG. 7, unnecessary portions of the hole injection film 16a and the light-emitting film 17a are removed by the use of an isotropic etching method using the cathode layer 18, thereby forming the hole injection layer 16 and the light-emitting layer 17. As a result, the outlines of the cathode layer 18, the hole injection layer 16, and the light-emitting layer 17 become the same in a direction perpendicular to the main substrate 11, and the layers overlap each other.

Examples of the etching method which can be employed in the process include an ion etching method using nitrogen or argon or a wet etching method, in addition to an oxygen plasma etching method. Generally, in the oxygen plasma etching method, when a slight gap exists between a mask and a layer, plasma infiltrates the gap, thereby damaging the layer covered with the mask. However, as described above, since the cathode layer 18 is in close contact with the light-emitting film 17a and thus no gap exists between the two, the damage does not occur. In addition, since no gap exists between the light-emitting layer 17 and the hole injection layer 16 or between the hole injection layer 16 and the protective layer 15, the light-emitting layer 17 and the hole injection layer 16 are not damaged.

Figure 8:
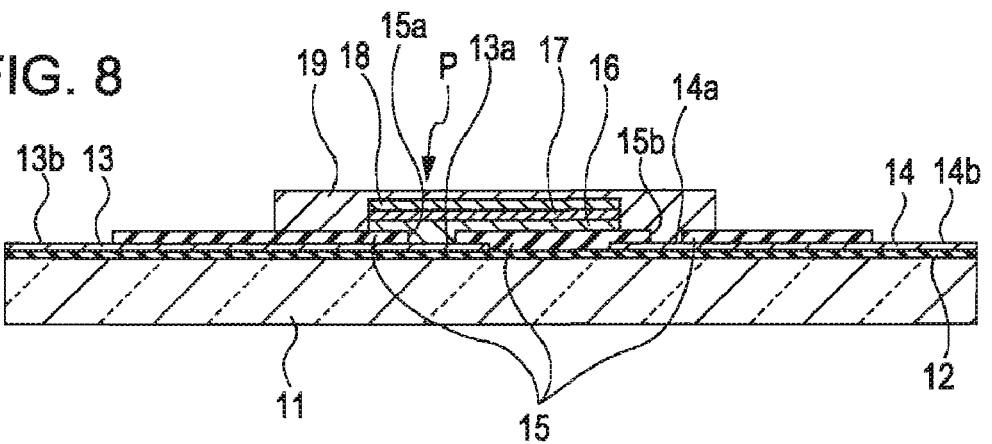
FIG. 8 is a diagram illustrating a step subsequent to the step shown in FIG. 7.

As shown in FIG. 8, the cathode-coating conductive layer 19 is selectively formed to be in close contact with the cathode layer 18, the cathode contact portions 14a, and the protective layer 15. Specifically, a metal mask in which a portion corresponding to the cathode-coating conductive layer 19 is opened is disposed on the cathode layer 18, the cathode-coating conductive layer 19 is formed by the use of an evaporation method or a sputtering method, and then the metal mask is removed. As a result, it is possible to obtain the cathode-coating conductive layer 19 which is in contact with the cathode layer 18 and does not overlap the external connection portions 13b and the external connection portions 14b. At this time, the second through-holes 15b formed through the protective layer 15 are filled with the material of the cathode-coating conductive layer 19, thereby connecting the cathode layer 18 to the cathode contact portions 14a of the cathode terminals 14 through the cathode-coating conductive layer 19. As described above, since the hole injection film 16a and the light-emitting film 17a are sufficiently removed from the cathode contact portions 14a, the ohmic resistance between the cathode-coating conductive layer 19 and the cathode terminals 14 is sufficiently lowered. On the other hand, in forming the cathode-coating conductive layer 19, a method of disposing the material of the cathode-coating conductive layer 19 over the entire surface of the main substrate 11 and forming the cathode-coating conductive layer 19 by the use of the photolithographic etching may be employed.

As shown in FIG. 2, the sealing substrate 21 is fixed to the main substrate 11 with the adhesive 20 so as to seal the hole injection layer 16, the light-emitting layer 17, the cathode layer 18, and the cathode-coating conductive layer 19. The sealing process is necessary specifically when the organic EL elements are used as the light-emitting elements, and is performed to protect the light-emitting elements from the external environment and thus to suppress deterioration due to oxygen or moisture. At the time of performing the sealing process, the sealing substrate 21 and the adhesive 20 are disposed so as not to overlap the external connection portions 13b and the external connection portions 14b. Accordingly, the external connection portions 13b and the external connection portions 14b are exposed.

The material of the light-emitting functional layer has a low affinity with the adhesive. Accordingly, it is preferable that the material of the light-emitting functional layer is removed from the portion to be applied with the adhesive as much as possible. In the light-emitting device 10, the adhesive 20 is applied onto the top surface of the protective layer 15, but the unnecessary portions of the hole injection film 16a and the light-emitting film 17a are sufficiently removed from the portion to which the adhesive 20 is to be applied. Therefore, the bonding strength by the adhesive 20 is sufficient.

Thereafter, terminals of a flexible board connected to the external device are connected to the external connection portions 13b and 14b. This connection is performed through adhesion using, for example, an anisotropic conductive material. However, the material of the light-emitting functional layer has a low affinity with the anisotropic conductive material. Accordingly, it is preferable that the material of the light-emitting functional layer is removed from the portion contacting the anisotropic conductive material as much as possible. In the light-emitting device 10, the anisotropic conductive material is in contact with the external connection portions 13b and 14b, but the unnecessary portions of the hole injection film 16a and the light-emitting film 17a are sufficiently removed from the external connection portions 13b and 14b. Accordingly, the bonding strength of the anisotropic conductive material is sufficiently great. Therefore, the connection strength and quality of the terminals of the flexible board are sufficient.

As described above, in the light-emitting device 10, since the second electrode layer 15b covers at least the pixel areas P, which overlap the first through-holes 15a, in the light-emitting functional layer (the set of the hole injection layer 16 and the light-emitting layer 17), the cathode layer 18 can be used as a mask when the light-emitting layer other than that covering the pixel areas P is removed by etching after the material of the light-emitting functional layer is applied onto the main substrate 11 in manufacturing the light-emitting device 10. In addition, since the cathode layer 18 is in close contact with the light-emitting functional layer, an etching medium such as plasma can be prevented from infiltrating the boundary between the cathode layer 18 and the light-emitting functional layer even when an isotropic etching method such as an oxygen plasma etching method is used, thereby preventing the light-emitting functional layer from being damaged.

In the light-emitting device 10, by applying the material of the light-emitting functional layer widely onto the main substrate 11 to form a film (the hole injection film 16a and the light-emitting film 17a), the lines (anode terminals 13 and cathode terminals 14) and the protective layer 15, which are located below the light-emitting functional layer, on the main substrate 11 are covered with the film. However, since the cathode layer 18 does not overlap the second through-holes 15b of the protective layer 15, the material of the light-emitting functional layer can be sufficiently removed from the second through-holes 15b by forming the film so as to cover the protective layer 15 and then an isotropically etching the film, thereby exposing the cathode contact portions 14a of the cathode terminals 14 through the second through-holes 15b. Accordingly, the second through-holes 15b formed through the protective layer 15 can be filled with the cathode-coating conductive layer 19, and the cathode layer 18 is satisfactorily connected to the cathode contact portions 14a of the cathode terminals 14 through the cathode-coating conductive layer 19. In addition, since the protective layer 15 does not overlap the external connection portions 13b and 14b and the cathode layer 18 does not overlap the external connection portions 13b and 14b, the light-emitting functional layer on the external connection portions 13b and 14b can be sufficiently removed by the anisotropic etching, thereby exposing the external connection portions 13b and 14b. Consequently, in manufacturing the light-emitting device 10, it is possible to sufficiently remove the unnecessary portion of the light-emitting functional layer on the lines using the cathode layer 18 as a mask after applying the material of the light-emitting functional layer onto the main substrate 11. This contributes to enhancements in productivity and quality of the light-emitting device 10.

Second Embodiment

A light-emitting device (electro-optical device) 30 according to a second embodiment of the invention will be described. The light-emitting device 30 is greatly different from the light-emitting device 10 in structure of a cathode. Paying attention to this point, the structure of the light-emitting device 30 will be described with reference to the drawings.

Figure 9:
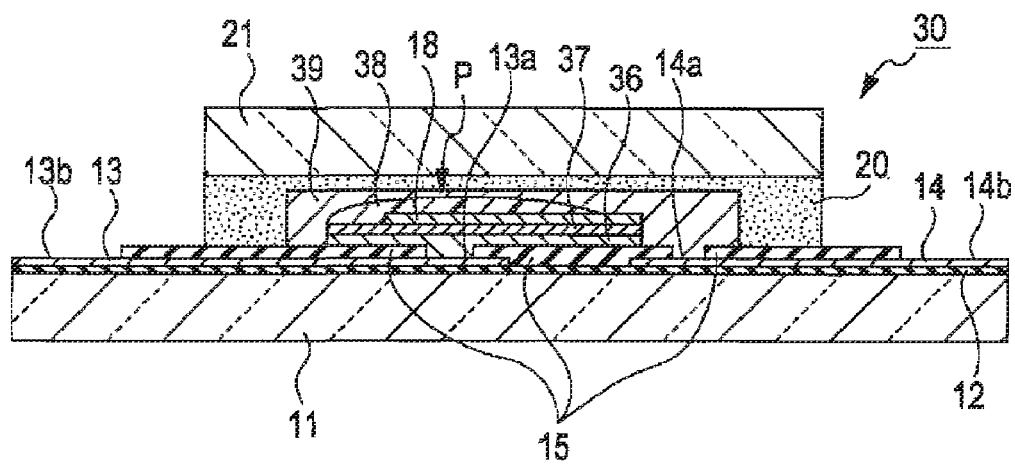
FIG. 9 is a cross-sectional view, similar to FIG. 2, illustrating a light-emitting device (electro-optical device) according to a second embodiment of the invention.

FIG. 9 is a cross-sectional view of the light-emitting device 30, which is similar to FIG. 2. As shown in the figure, in the light-emitting device 30, a hole injection layer 36 transmitting light is formed on the protective layer 15 and the anode layers 13a, a light-emitting layer 37 formed of an EL material and surface-emitting light is formed on the hole injection layer 36, and the cathode layer 18 is formed on the light-emitting layer 37, in the state that the right ends in the figure correspond to each other. A sealing resin 38 for preventing oxidation of the cathode layer 18 is in close contact with the top surface of the cathode layer 18. The area, which the sealing resin 38 is closely bonded onto, on the cathode layer 18 covers the first through-holes 15a, and does not overlap the second through-holes 15b, the external connection portions 13b, and the external connection portions 14b. A material such as epoxy thermosetting resin can be used as the sealing resin 38.

A cathode-coating conductive layer 39 similar to the cathode-coating conductive layer 19 is closely bonded onto the area, which the sealing resin 38 is not closely bonded onto, on the cathode layer 18 and the sealing resin 38 and the cathode-coating conductive layer 39 are in close contact with the side surfaces of the cathode layer 18. That is, the cathode layer 18 is surrounded with the sealing resin 38, the cathode-coating conductive layer 39, and the light-emitting layer 37. The light-emitting layer 37 is similar to the above-mentioned light-emitting layer 17 and has an area larger than that of the light-emitting layer 17. The sealing resin 38 is closely bonded onto the area, which is not covered with the cathode layer 18, on the light-emitting layer 37. That is, the top surface of the light-emitting layer 37 is covered with the cathode layer 18 and the sealing resin 38. On the other hand, the cathode-coating conductive layer 39 is different from the above-mentioned cathode-coating conductive layer 19, in that it surrounds the hole injection layer 36, the light-emitting layer 37, and the cathode layer 38 instead of the hole injection layer 16, the light-emitting layer 17, and the cathode layer 18, and in that it is in, close contact with the sealing resin 38 above the light-emitting layer 37 to surround the sealing resin 38. The hole injection layer 36 is similar to the above-mentioned hole injection layer 16 and has an area larger than that of the hole injection layer 16.

A procedure of manufacturing the light-emitting device 30.

First, in the same procedure as manufacturing the light-emitting device 10, the processes up to the formation of the cathode layer 18 are preformed (see FIGS. 3 to 6). Then, as shown in FIG. 10, the sealing resin 38 is applied onto the cathode layer 18, and is dried and solidified. Known methods such as a dispensing method or a printing method can be used as the application method. Through this application, the sealing method 38 is closely bonded onto a part of the top surface of the cathode layer 18, a part of the side surface thereof (the area, which is not in close contact with the cathode-coating conductive layer 39, on the top surface and the side surface of the cathode layer 18), and the exposed area on the light-emitting layer 37. As a result, the light-emitting layer 37 is covered with the sealing resin 38 and the cathode layer 18.

As show in FIG. 11, the unnecessary portions of a hole injection film 16a and a light-emitting film 17a are sufficiently removed at a time by the use of an isotropic etching method using the cathode layer 18 and the sealing resin 38 as a mask, thereby forming the hole injection layer 36 and the light-emitting layer 37. Here, the etching methods used for manufacturing the light-emitting device 10 can be employed. As described above, since the light-emitting layer 37 is in close contact with the sealing resin 38 and the cathode layer 18 and no gap exists between both, the light-emitting layer 37 is not damaged in the process. Of course, the hole infection layer 36 is also not damaged.

As a result of the process, the first through-holes 15a are covered with the hole injection layer 36 and the light-emitting layer 37, and the unnecessary portions of the hole injection film 16a and the light-emitting film 17a are sufficiently removed at a time from the external connection portions 13b, the cathode contact portions 14a, and the external connection portions 14b. On the other hand, the outline of the set of the cathode layer 18 and the sealing resin 38, the outline of the hole injection layer 36, and the outline of the light-emitting layer 37 correspond to each other in the direction perpendicular to the main substrate 11, thereby overlapping each other.

As shown in FIG. 12, the cathode-coating conductive layer 39 is selectively formed on the cathode layer 18, the sealing resin 38, the cathode contact portions 14a, and the protective layer 15. The formation method is similar to the formation method of the cathode-coating conductive layer 19. As a result of the process, the cathode layer 18 is connected to the cathode contact portions 14a of the cathode terminals through the cathode-coating conductive layer 39. At this time, the cathode-coating conductive layer 39 does not overlap the external connection portions 13b and the external connection portions 14b.

As shown in FIG. 13, the sealing substrate 21 is fixed to the main substrate 11 with the adhesive 20 so as to seal the hole injection layer 36, the light-emitting layer 37, the cathode layer 18, the sealing resin 38, and the cathode-coating conductive layer 39. The details of the fixation are similar to those of the light-emitting device 10 described above.

As can be apparently seen from the description made above, the light-emitting device 30 has the same advantages as the light-emitting device 10.

In addition, according to the light-emitting device 30, even when the unnecessary portions of the hole injection film 16a and the light-emitting film 17a are removed by the oxygen plasma etching method, the oxidation of the cathode layer 18 in the area covered with the sealing resin 38 is suppressed. In addition, since the cathode layer 18 and the sealing resin 38 are in close contact with each other, oxygen can be prevented from infiltrating the boundary between both. When methods other than the oxygen plasma etching method are used, there is possibility that the cathode layer 18 is oxidized to increase the resistance in an oxygen atmosphere such as an atmosphere, but such possibility can be reduced in the light-emitting device 30. On the other hand, since the cathode-coating conductive layer 39 is in close contact with the top surface of the area, which the sealing resin 38 is not in contact with, on the cathode layer 18, the oxidation of the cathode layer 18 in the area not covered with the sealing resin 38 can be prevented to some extent by the cathode-coating conductive layer 39, thereby suppressing the increase in resistance of the cathode layer 18. This advantage can be also obtained from the light-emitting device 10.

Modified Examples (1) By modifying the above-mentioned embodiments, a part or all of a circuit for driving or controlling the light-emitting elements may be formed on the main substrate 11. A light-emitting device (electro-optical device) 40 according to a modified example of the light-emitting device 10 will be described. In the light-emitting device 40, a part of the circuit for driving the light-emitting elements is formed on the main substrate Is.

FIG. 14 is a cross-sectional view of the light-emitting device 40 and is similar to FIG. 2. As shown in the figure, a circuit stacked body 46 is formed on the base insulating layer 12 of the main substrate 11 by forming films. A TFT (Thin Film Transistor) 47 is disposed for each light-emitting element in the circuit stacked body 46. The TFT 47 serves to drive the corresponding light-emitting element in accordance with a signal from the anode terminal 13. A gate line (line) 43 is connected to the gate 47G thereof, a source potential is supplied to the drain 47D thereof through a drain line (line) not shown from a high-potential power supply line not shown, and the anode layer (first anode layer) 42 is connected to the source 47S thereof.

The lines used as the gate line 43, the drain line not shown, the anode layer 42, and the cathode terminal 14 are selectively formed in the same layer on the TFT circuit stacked body 46. The material of the lines is equal to that of the lines in the light-emitting device 10. In addition, the protective layer 45 is formed so that the gate line 43, the drain line not shown, the anode layer 42, and the cathode terminal 14 are isolated from each other. That is, when a switching signal From a circuit not shown is given to the gate 47G of the TFT 47 through the gate line 43, current flows between the drain 47D and the source 47S.

On the other hand, although the light-emitting device 40 obtained by modifying the light-emitting device 10 has been exemplified, the light-emitting device 30 may be subjected to the same modification.

(2) Although the light-emitting devices 10, 30, and 40 according to the above-mentioned embodiments have a single cathode layer (second electrode) 18 common to all the light-emitting elements, the respective light-emitting elements may have a single cathode layer independent from the cathode layer of another light-emitting element and at least one cathode terminal may be connected to the respective cathode layers. Alternatively, the main substrate 11 may be partitioned into a plurality of areas, one cathode layer may be provided in the respective areas, and the respective cathode layers may be common to a plurality of light-emitting elements in the corresponding area. In this way, when a plurality of second electrode layers are disposed at positions spaced from each other, the light-emitting functional layer partially etched in manufacturing the layers below the second electrode layers remains in the areas masked by the second electrode layer. In any way, the second electrode layers are in close contact with the top surface of the light-emitting functional layer in the areas overlapping the first through-holes of the protective layer, and supplies a voltage to the light-emitting functional layer in cooperation with the first electrode layer below the first through-holes.

(3) In the above-mentioned embodiments, the anode layers 13*a* transmitting light is disposed below the light-emitting functional layer (a set of the light-emitting layer and the hole injection layer) and the cathode layer 18 is disposed above the light-emitting functional layer. However, the light-transmitting cathode layer may be disposed below the light-emitting functional layer and the anode layer may be disposed above the light-emitting functional layer. In this case, each light-emitting element may have a light-transmitting cathode layer independent of a cathode layer of another light-emitting element, or a plurality of light-emitting elements may be supplied with a ground potential through a light-transmitting cathode layer common to other light-emitting elements. However, each light-emitting element should have an anode layer independent of the anode layer of another light-emitting layer and should be supplied with a source voltage from an anode terminal independent of the anode terminal of another light-emitting element. The anode layers are connected to the corresponding anode terminals through, for example, a conductor equal to an anode-coating conductive layer having a coating function and a connection function similar to those of the above-mentioned cathode-coating conductive layer 19.

Applications

The light-emitting devices according to the embodiments and the modified examples can be applied to a variety of exposure apparatuses, lighting apparatuses, and image display apparatuses emitting monochroic light. Examples of the exposure apparatus include a line-type optical head for writing a latent image on an image carrier in an image forming apparatus using electro-photography. Examples of the image forming apparatus include a printing unit of a printer and a copier and a printing portion of a facsimile.

FIG. 15 is a longitudinal sectional view illustrating an example of an image forming apparatus using the light-emitting devices according to the embodiments and the modified examples as a line-type exposure head. In the light-emitting devices, it is assumed that the pixel areas P are arranged in a zigzag shape in two lines. The image forming apparatus is a tandem-type full color image forming apparatus using a belt intermediate transfer system.

In the image forming apparatus, four exposure heads 10K, 10C, 10M, and 10Y having the same structure are disposed at exposure positions of four photosensitive drums (image carriers) 110K, 110C, 110M, and 110Y having the same structure.

As shown in FIG. 15, the image forming apparatus is provided with a driving roller 121 and a driven roller 122, an endless intermediate transfer belt 120 is wound around the rollers 121 and 122 to rotate around the rollers 121 and 122 as indicated by the arrow. Although not shown, a tension applying portion such as a tension roller applying tension to the intermediate transfer belt 120 may be provided.

Four photosensitive drums 110K, 110C, 110M, and 110Y having a photosensitive layer on the outer circumferential surface thereof are arranged with a predetermined gap therebetween around the intermediate transfer belt 120. The additional characters K, C, M, and Y means that they are used for forming toner images of black, cyan, magenta, and yellow. This is true of other members. The photosensitive drums 110K, 110C, 110M, and 110Y are rotationally driven in synchronization with the intermediate transfer belt 120.

Corona charging units 111 (K, C, M, Y), exposure heads 10 (K, C, M, and Y), developing units 114 (K, C, M, and Y) are disposed around the photosensitive drums 110 (K, C, M, and Y), respectively. The corona charging units 111 (K, C, M, and Y) charge the outer circumferential surfaces of the corresponding photosensitive drums 110 (K, C, M, and Y) constantly. The exposure heads 10 (K, C, M, and Y) write electrostatic latent images on the charged outer circumferential surfaces of the photosensitive drums. The exposure heads 10 (K, C, M, and Y) are disposed so that the arrangement direction of the light-emitting elements is equal to a primary scanning direction of the photosensitive drums 110 (K, C, M, and Y). The writing of the electrostatic latent images is performed by irradiating light to the photosensitive drums by the use of the light-emitting elements. The developing units 114 (K, C, M and Y) form toner images, that is, visible images, on the photosensitive drums by attaching toners as developer to the electrostatic latent images.

The toner images of black, cyan, magenta, and yellow formed by four single-color developing stations are sequentially transferred to the intermediate transfer belt 120 and are thus superposed on the intermediate transfer belt 120. As a result, four first transfer corotrons (developing units) 112 (K, C, M, and Y) are disposed inside the intermediate transfer belt 120. The first transfer corotrons 112 (K, C, M, and Y) are disposed in the vicinity of the photosensitive drams 110 (K, C, M, and Y), respectively, and transfer the toner images to the intermediate transfer belt 120 passing through between the photosensitive drums and the firs transfer corotrons by absorbing the toner images from the photosensitive drams 110 (K, C, M, and Y) in an electrostatic manner.

A sheet 102 as a target on which an image is finally formed is fed one by one from a sheet feed cassette 101 by a pickup roller 103, and is sent to a nip between the intermediate transfer belt 120 and a second transfer roller 126 adjacent to the driving roller 121. The full-color toner image on the intermediate transfer belt 120 is second transferred to one surface of the sheet 102 by the second transfer roller 126 at a time and is fixed to the sheet 102 by passing through a fixing roller pair 127 as a fixing unit. Thereafter, the sheet 102 is discharged to a discharge cassette disposed at the upper portion of the apparatus by a discharge roller pair 128.

Since the above-mentioned image forming apparatus employs the above-mentioned light-emitting devices as a writing unit, it is possible to accomplish decrease in size of the apparatus in comparison with an apparatus employing a laser scanning optical system. In addition, since the above-mentioned light-emitting devices are excellent in productivity and quality in comparison with a known case, it is possible to contribute to enhancement in productive and quality of the image forming apparatus.

Next, an image forming apparatus according to another embodiment of the invention will be described.

FIG. 16 is a longitudinal sectional view illustrating another image forming apparatus using the above-mentioned light-emitting devices as a line-type exposure head. The image forming apparatus is a rotary-developing full color image forming apparatus using a belt intermediate transfer system. In the image forming apparatus shown in FIG. 18, a corona charging unit 168, a rotary developing unit 161, an exposure head 167, and an intermediate transfer belt 169 are disposed around a photosensitive drum (image carrier) 165.

The corona charging unit 168 charges the outer circumferential surface of the photosensitive drum 165 constantly. The exposure head 167 writes an electrostatic latent image on the charged outer circumferential surface of the photosensitive drum 165. The exposure head 167 is disposed so that the arrangement direction of a plurality of light-emitting elements is equal to the primary scanning direction of the photosensitive drum 165. The writing of the electrostatic latent image is performed by irradiating light to the photosensitive drum by the use of the light-emitting elements.

The developing unit 161 is a drum in which four developing devices 163Y, 163C, 163M, and 163K are disposed with an angle interval of 90°, and is rotatable in the counterclockwise direction about an axis 161a. The developing devices 163Y, 163C, 163M, and 163K supply toners of yellow, cyan, magenta, and black to the photosensitive drum 165, and form a toner image, that is, a visible image, on the photosensitive drum 165 by attaching the toners as developer to the electrostatic latent image.

An endless intermediate transfer belt 169 is wound on a driving roller 170a, a driven roller 170b, a first transfer roller 166, and a tension roller, and rotates in the direction indicated by the arrow around the rollers. The first transfer roller 166 transfers the toner image to the intermediate transfer belt 169 passing between the photosensitive drum 165 and the first transfer roller 166, by absorbing the toner image from the photosensitive drum 165 in an electrostatic manner.

Specifically, in the first rotation of the photosensitive drum 165, an electrostatic latent image of yellow (Y) is written thereto by the exposure head 167, a toner image of the same color is formed by the developing device 163Y, and then the toner image is transferred to the intermediate transfer belt 169. In the next rotation, an electrostatic latent image of cyan (C) is written thereto by the exposure head 167, a toner image of the same color is formed by the developing device 163C, and then the toner image is transferred to the intermediate transfer belt 169 so as to overlap the toner image of yellow. In this way, in four rotations of the photosensitive drum 165, the toner images of yellow, cyan, magenta, and black are sequentially made to overlap each other on the intermediate transfer belt 169, and a full-color image is thus formed on the intermediate transfer belt 169. Finally, when images are formed on both surfaces of a sheet as a target on which an image is formed, a full-color toner image can be obtained on the intermediate transfer belt 169, in such a way that the toner images of the same color on the front and back surfaces are transferred to the intermediate transfer belt 169 and then the toner images of the next colors on the front and back surfaces are transferred to the intermediate transfer belt 169.

In the image forming apparatus, a sheet carrying passage 174 through which a sheet passes is provided. The sheet is picked up one by one from the sheet feed cassette 178 by the pickup roller 179 and is carried through the sheet carrying passage 174 by the carrying roller, and passes through a nip between the intermediate transfer belt 169 and the second transfer roller 171 adjacent to the driving roller 170a. The second transfer roller 171 transfers a toner image on one surface of the sheet by absorbing a full-color toner image from the intermediate transfer belt 169 at a time in an electrostatic mariner The second transfer roller 171 gets close to or apart from the intermediate transfer belt 169 by a clutch not shown. When the full-color image is transferred to the sheet, the secondary transfer roller 171 comes in contact with the intermediate transfer belt 169, and when the toner image 169 is repeatedly transferred to the intermediate transfer belt 169, the second transfer roller 171 is separated therefrom.

The sheet to which an image is transferred as described above is carried to the fixing device 172 and passes through a heating roller 172a and a pressurizing roller 172b of the fixing device 172, thereby fixing the image on the sheet. The sheet having been subjected to the fixing process is attracted by the discharge roller pair 176 and travels in the direction indicated by the arrow F. In case of double-sided print, after most of the sheet passes through the discharge roller pair 176, the discharge roller pair 176 reversely rotates and thus the sheet is introduced into a double-sided print carrying passage 175 as indicated by the arrow G. The toner image is transferred to the other surface of the sheet by the second transfer roller 171, the sheet is subjected again to the fixing process in the fixing device 172, and then the sheet is discharged by the discharge roller pair 176.

Since the image forming apparatus shown in FIG. 16 employs the above-mentioned light-emitting devices as the writing unit, it is possible to accomplish decrease in size of the apparatus in comparison with an apparatus employing a laser scanning optical system. In addition, since the above-mentioned light-emitting devices are excellent in productivity and quality in comparison with a known case, it is possible to contribute to enhancement in productive and quality of the image forming apparatus.

Although the image forming apparatus capable of employing the various light-emitting devices according to the embodiments and the modified examples described above have been described hitherto, the light-emitting devices can be applied to image forming apparatuses with different electrophotographic systems, and such image forming apparatuses belongs to the scope of the invention. The above-mentioned light-emitting devices can be applied to an image forming apparatus in which a toner image is transferred directly to a sheet from a photosensitive drum without using an intermediate transfer belt or an image forming apparatus for forming a black and white image.

Next, a variety of image display apparatuses employing the light-emitting devices according to the embodiments and modified examples described above will be described.

FIG. 17 illustrates a configuration of a personal computer (image display apparatus) using the light-emitting devices as a display unit 91. A personal computer 2000 includes a display unit 91 and a main body 2010. A power switch 2001 and a keyboard 2002 are provided in the main body 2010. Since the light-emitting device employing EL elements as the light-emitting elements is used as the display unit 91, the personal computer 2000 can display an image with a wide viewing angle and good visibility. Since the display unit 91, is excellent, in productivity and quality in comparison with a known display unit, it is possible to contribute to enhancement in productivity and quality of the personal computer 2000.

FIG. 18 illustrates a configuration of a mobile phone (image display apparatus) employing the light-emitting devices described as a display unit 92. A mobile phone 3000 includes a plurality of operation buttons 3001, scroll buttons 3002, and a display unit 92. The image displayed on the electro-optical device 1 is scrolled by operating the scroll buttons 3002. The mobile phone 3000 can display an image with a wide viewing angle and good visibility. Since the display unit 92 is excellent in productivity and quality in comparison with a known display unit, it is possible to contribute to enhancement in productivity and quality of the mobile phone 3000.

The entire disclosure of Japanese Patent Application No. 2005-169172, filed Jun. 9, 2005 is expressly incorporated by reference herein.

What is claimed is:

1. An electro-optical device comprising:
    a substrate;
    a first line over the substrate;
    a protective layer formed on the first line;
    a first through-hole formed through the protective layer on the first line;
    a conductor bonded to the first line through the first through-hole; and
    a light emitting element including:
        a first electrode layer formed over the substrate;
        a light-emitting functional layer formed on the first electrode layer, and formed above a layer of the first line; and
        a second electrode layer formed on the light-emitting functional layer and bonded to the conductor, wherein the conductor surrounds whole the second electrode layer.

2. The electro-optical device according to claim 1, further comprising:
    a second through-hole formed through the protective layer on the first line, and located at a first area where the second electrode layer is not formed.

3. The electro-optical device according to claim 1, further comprising:
    a thin film transistor formed over the substrate, and formed below the first electrode layer,
    a second line controlling the thin film transistor,
    a third through-hole formed through the protective layer on the second line, and located at a second area where the second electrode layer is not formed.

4. The electro-optical device according to claim 1, further comprising:
    a sealing resin formed on the second electrode layer, wherein
    the conductor is bonded to a third area of the second electrode layer, where the sealing resin is not bonded to.

5. An image forming apparatus comprising:
    an image carrier;
    a charging unit for electrically charging the image carrier;
    the electro-optical device of claim 1 in which a plurality of the light-emitting elements are arranged and light is irradiated to a charged surface of the image carrier by the use of the plurality of light-emitting elements to form a latent image;
    a developing unit for forming a toner image on the image carrier by attaching a toner to the latent image; and
    a transfer unit for transferring the toner image to a body from the image carrier.

6. An image forming apparatus comprising:
    an image carrier;
    a charging unit for electrically charging the image carrier;
    the electro-optical device of claim 2 in which a plurality of the light-emitting elements are arranged and light is irradiated to a charged surface of the image carrier by the use of the plurality of light-emitting elements to form a latent image;
    a developing unit for forming a toner image on the image carrier by attaching a toner to the latent image; and
    a transfer unit for transferring the toner image to a body from the image carrier.

7. An image forming apparatus comprising:
    an image carrier;
    a charging unit for electrically charging the image carrier;
    the electro-optical device of claim 3 in which a plurality of the light-emitting elements are arranged and light is irradiated to a charged surface of the image carrier by the use of the plurality of light-emitting elements to form a latent image;
    a developing unit for forming a toner image on the image carrier by attaching a toner to the latent image; and
    a transfer unit for transferring the toner image to a body from the image carrier.

8. An image forming apparatus comprising:
    an image carrier;
    a charging unit for electrically charging the image carrier;
    the electro-optical device of claim 4 in which a plurality of the light-emitting elements are arranged and light is irradiated to a charged surface of the image carrier by the use of the plurality of light-emitting elements to form a latent image;
    a developing unit for forming a toner image on the image carrier by attaching a toner to the latent image; and
    a transfer unit for transferring the toner image to a body from the image carrier.

* * * * *